US010431533B2

(12) United States Patent
Topacio et al.

(10) Patent No.: US 10,431,533 B2
(45) Date of Patent: Oct. 1, 2019

(54) CIRCUIT BOARD WITH CONSTRAINED SOLDER INTERCONNECT PADS

(71) Applicants: Roden Topacio, Springwater (CA); Andrew KW Leung, Markham (CA)

(72) Inventors: Roden Topacio, Springwater (CA); Andrew KW Leung, Markham (CA)

(73) Assignee: ATI Technologies ULC, Markham (CA)

( * ) Notice: Subject to any disclaimer, the term of this patent is extended or adjusted under 35 U.S.C. 154(b) by 558 days.

(21) Appl. No.: 14/529,859

(22) Filed: Oct. 31, 2014

(65) Prior Publication Data

US 2016/0126171 A1    May 5, 2016

(51) Int. Cl.
*H01L 21/44* (2006.01)
*H01L 23/498* (2006.01)

(52) U.S. Cl.
CPC .. *H01L 23/49816* (2013.01); *H01L 23/49822* (2013.01); *H01L 23/49894* (2013.01); *H01L 23/49811* (2013.01); *H01L 23/49827* (2013.01); *H01L 2224/16225* (2013.01); *H01L 2224/32225* (2013.01); *H01L 2224/73204* (2013.01); *H01L 2924/15311* (2013.01)

(58) Field of Classification Search
CPC ......... H01L 24/01; H01L 24/10; H01L 24/11; H01L 24/13; H01L 24/81
USPC ........................ 438/612–617; 257/737, 738
See application file for complete search history.

(56) References Cited

U.S. PATENT DOCUMENTS

| 5,471,090 A | 11/1995 | Deutsch et al. |
| 5,706,178 A | 1/1998 | Barrow |
| 5,759,910 A | 6/1998 | Mangold et al. |
| 5,831,369 A | 11/1998 | Furbacher et al. |
| 5,859,474 A | 1/1999 | Dordi |
| 6,057,222 A * | 5/2000 | Pahl ..................... H01L 23/3171 228/180.21 |
| 6,362,090 B1 * | 3/2002 | Paik ..................... H01L 21/288 257/737 |
| 6,717,262 B1 | 4/2004 | Moriizumi et al. |
| 6,809,262 B1 | 10/2004 | Hsu |
| 6,913,948 B2 | 7/2005 | Caletka et al. |
| 7,335,995 B2 | 2/2008 | Pflughaupt et al. |
| 7,339,275 B2 | 3/2008 | Wang et al. |
| 7,670,939 B2 | 3/2010 | Topacio et al. |
| 8,378,471 B2 | 2/2013 | Topacio et al. |
| 2004/0080049 A1 * | 4/2004 | Kim ....................... H01L 24/11 257/750 |
| 2004/0238953 A1 | 12/2004 | Murtuza et al. |

(Continued)

FOREIGN PATENT DOCUMENTS

EP    2209358 A1    7/2010

OTHER PUBLICATIONS

PCT/CA2015/051015 International Search Report dated Nov. 12, 2015.

(Continued)

*Primary Examiner* — Brook Kebede
(74) *Attorney, Agent, or Firm* — Timothy M. Honeycutt

(57) ABSTRACT

Various circuit boards and methods of manufacturing the same are disclosed. In one aspect, a method of manufacturing is provided that includes forming a solder mask on a circuit board with a first opening that has a sidewall. A solder interconnect pad is formed in the first opening. The sidewall sets the lateral extent of the solder interconnect pad.

20 Claims, 7 Drawing Sheets

(56) References Cited

U.S. PATENT DOCUMENTS

| | | |
|---|---|---|
| 2005/0023327 A1 | 2/2005 | Pendse |
| 2005/0189622 A1 | 9/2005 | Humpston et al. |
| 2006/0000877 A1* | 1/2006 | Wang .................. B23K 3/0623 228/180.22 |
| 2006/0024944 A1* | 2/2006 | Jung ...................... H01L 24/03 438/612 |
| 2008/0014738 A1 | 1/2008 | Kim et al. |
| 2000/0116534 | 5/2010 | Choi et al. |
| 2011/0110061 A1* | 5/2011 | Leung .................... H05K 1/115 361/783 |
| 2013/0180766 A1* | 7/2013 | Lee ...................... H05K 3/3463 174/255 |

OTHER PUBLICATIONS

Wolf et al.; *Silicon Processing for the VLSI Era*, vol. 1: *Process Technology*; 1986; pp. 534-536.
EP 15854911.3 Examination Report dated Jun. 5, 2018.

* cited by examiner

CIRCUIT BOARD WITH CONSTRAINED SOLDER INTERCONNECT PADS

BACKGROUND OF THE INVENTION

1. Field of the Invention

This invention relates generally to semiconductor processing, and more particularly to circuit boards with solder interconnect pads and to methods of making the same.

2. Description of the Related Art

Various conventional organic semiconductor chip package substrates interface electrically with a flip-chip mounted semiconductor chip by way of multiple solder bumps. In some conventional designs, the solder bumps or portions thereof are positioned in holes formed in a solder mask that is the outermost layer of the circuit board. The holes are intended to be vertically registered with underlying bump pads. In conventional designs, the bump pads are fabricated with a lateral dimension that is larger than the solder mask hole. This creates an interface between the solder mask and the upper surface of the bump pad.

The conventional solder interconnect pads are typically formed on underlying vias. At these locations, the solder mask can be subjected to bending moments. These bending moments can cause delamination of the solder mask at the bump pad upper surface. Delamination can produce pathways for solder from an overlying bump to migrate laterally and potentially short to adjacent conductor structures, such as traces or other bump pads.

There is an on-going trend to squeeze more routing into circuit boards, particularly semiconductor chip package substrates. The need for greater routing complexity is caused by, among other things, increases in the number of input/outputs of ever more complex semiconductor die designs. It is not a trivial matter to insert more traces and vias into a circuit board layout. Indeed, the goal of increased routing must compete with design rules, which are put in place to ensure that manufacturing processes used to form the circuit board can do so reliably.

However, conventional techniques to address potential solder mask delamination often resort to enlarged bump pads or design rules that require greater conductor spacing, both of which weigh against greater packing density.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes forming a solder mask on a circuit board with a first opening that has a sidewall. A solder interconnect pad is formed in the first opening. The sidewall sets the lateral extent of the solder interconnect pad.

In accordance with another aspect of an embodiment of the present invention, a method of manufacturing is provided that includes forming a solder mask on a semiconductor chip package substrate. The mask includes a first opening that has a sidewall. A solder interconnect pad is formed in the first opening. The sidewall sets the lateral extent of the solder interconnect pad.

In accordance with another aspect of an embodiment of the present invention, a circuit board is provided that includes a solder mask on a circuit board. The solder mask has a first opening with a sidewall. A solder interconnect pad is in the first opening. The sidewall sets the lateral extent of the solder interconnect pad.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a printed circuit board, such as a semiconductor chip package substrate, are described herein. One example includes a solder mask and a solder interconnect pad, such as a bump pad, positioned in the opening such that the sidewall of the opening sets the lateral extent of the solder interconnect pad. Additional details will now be described.

Figure 1:
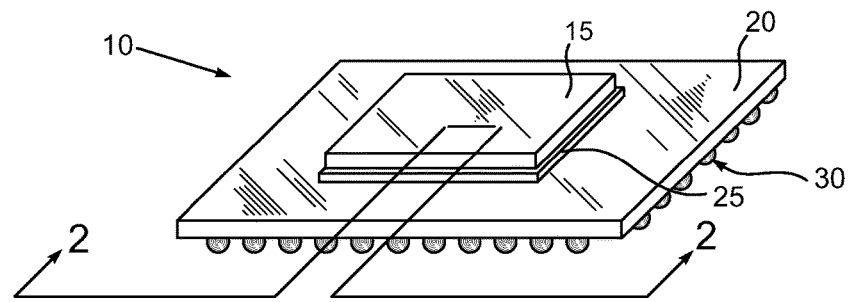
FIG. 1 is a pictorial view of an exemplary conventional semiconductor chip device that includes a semiconductor chip mounted on a circuit board.

In the drawings described below, reference numerals are generally repeated where identical elements appear in more than one figure. Turning now to the drawings, and in particular to FIG. 1, therein is shown a pictorial view of an exemplary embodiment of a circuit device 10 that includes a semiconductor chip 15 mounted on a circuit board 20. An underfill material layer 25 is positioned between the semiconductor chip 15 and the circuit board 20 to lessen the effects of differential CTE. The circuit board 20 is provided with a number of conductor traces and vias and other structures in order to provide power, ground and signals transfers between the semiconductor chip 15 and another circuit device that is not shown. To facilitate those transfers, the circuit board 20 may be provided with input/outputs in the form of a pin grid array, a ball grid array, a land grid array or other type of interconnect scheme. In this illustrative embodiment, the circuit board 20 is provided with a ball grid array consisting of plural solder balls 30.

The semiconductor chip 15 may be any of a myriad of different types of circuit devices used in electronics, such as, for example, microprocessors, graphics processors, combined microprocessor/graphics processors, system(s) on a chip, application specific integrated circuits, memory devices or the like, and may be single or multi-core or even stacked with additional dice. The semiconductor chip 15 may be constructed of bulk semiconductor, such as silicon or germanium, semiconductor on insulator materials, such as silicon-on-insulator materials, graphene or other materials. The semiconductor chip 15 may be flip-chip mounted to the circuit board 20 and electrically connected thereto by solder joints or other structures. Interconnect schemes other than flip-chip solder joints may be used.

The circuit board 20 may be a semiconductor chip package substrate, a circuit card, or virtually any other type of printed circuit board. Although a monolithic structure could be used for the circuit board 20, a more typical configuration will utilize a build-up design. In this regard, the circuit board 20 may consist of a central core upon which one or more build-up layers are formed and below which an additional one or more build-up layers are formed. The core itself may consist of a stack of one or more layers. One example of such an arrangement may be a 2-2-2 arrangement where a single-layer core is laminated between two sets of two build-up layers. If implemented as a semiconductor chip package substrate, the number of layers in the circuit board 20 can vary from four to sixteen or more, although less than four may be used. So-called "coreless" designs may be used as well. The layers of the circuit board 20 may consist of an insulating material, such as various well-known epoxies or other polymers, interspersed with metal interconnects. A multi-layer configuration other than build-up could be used. Optionally, the circuit board 20 may be composed of well-known ceramics or other materials suitable for package substrates or other printed circuit boards.

Figure 2:
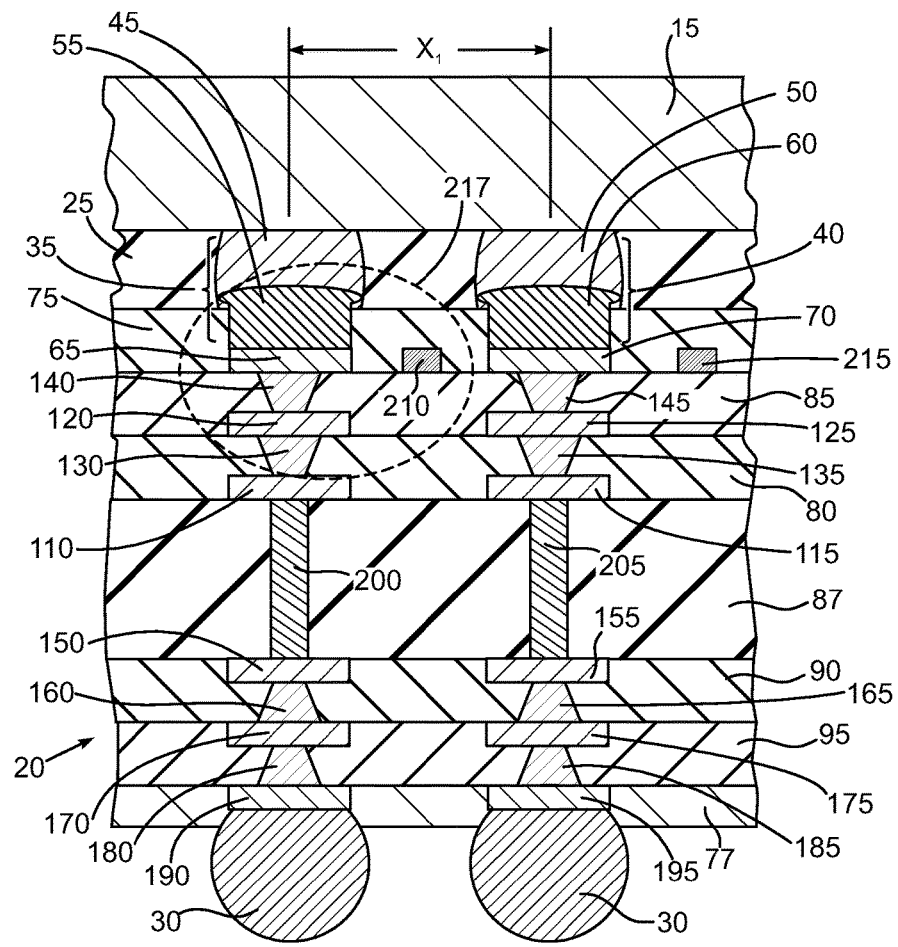
FIG. 2 is a sectional view of FIG. 1 taken at section 2-2.

Attention is now turned to FIG. 2, which is a sectional view of FIG. 1 taken at section 2-2. Note that section 2-2 only encompasses a rather small portion of the semiconductor chip 15 and the package substrate 20. The semiconductor chip 15 may be flip-chip mounted to the circuit board 20 and electrically interconnected thereto by solder bumps, solder joints, conductive pillars or other structures. In this illustrative embodiment, two solder interconnects or joints 35 and 40 are depicted and at least partially surrounded by the underfill 25. While only two solder joints 35 and 40 are depicted, there may be scores, hundreds or even thousands of such joints depending upon the size of complexity of the semiconductor chip 15 and the circuit board 20. The solder joints 35 and 40 may consist of respective solder bumps 45 and 50 that are coupled to the semiconductor chip 15 and presolders 55 and 60 that are metallurgically bonded to respective solder interconnect pads 65 and 70 of the circuit board 20. The solder bumps 45 and 50 are metallurgically coupled to the presolders 55 and 60 by way of a reflow and bump collapse process.

The solder bumps 45 and 50, and the solder balls 30 may be composed of various lead-based or lead-free solders. An exemplary lead-based solder may have a composition at or near eutectic proportions, such as about 63% Sn and 37% Pb. Lead-free examples include tin-silver (about 98.2% Sn 1.8% Ag), tin-copper (about 99% Sn 1% Cu), tin-silver-copper (about 96.5% Sn 3% Ag 0.5% Cu) or the like. The presolders 55 and 60 may be composed of the same types of materials. Optionally, the presolders 55 and 60 may be eliminated in favor of a single solder structure or a solder plus a conducting pillar arrangement. The underfill material layer 25 may be, for example, an epoxy resin mixed with silica fillers and phenol resins, and deposited before or after the re-flow process to establish the solder joints 35 and 40. The presolders 55 and 60 and the solder interconnect pads 65 and 70 are surrounded laterally by a solder mask 75 that is patterned lithographically, by laser ablation or the like, to form plural openings in order to accommodate the various presolders, for example, the presolders 55 and 60. Another solder mask 77 is positioned on the opposite side of the circuit board 20 to facilitate the attachment of the solder balls 30. The solder masks 75 and 77 may be fabricated from a variety of materials suitable for solder mask fabrication, such as, for example, PSR-4000 AUS703 manufactured by Taiyo Ink Mfg. Co., Ltd. or SR7000 manufactured by Hitachi Chemical Co., Ltd.

In this illustrative embodiment, the circuit board 20 is implemented as a semiconductor chip package with a 2-2-2 build-up design. In this regard, interconnect or build-up layers 80 and 85 formed on one side of a core 87 and interconnect or build-up layers 90 and 95 are formed on the opposite side of the core 87. The core 87 may be monolithic or a laminate or two or more layers as desired. The core 87 and the build-up layers 80, 85, 90 and 95 may be composed of well-known polymeric materials, such as, GX13 supplied by Ajinomoto, Ltd. The build-up layers 80, 85, 90 and 95, the core 87, and the solder masks 75 and 77 make up an interconnect system for the circuit board 20. The following discussion of the various conductor structures in FIG. 2 will be illustrative of other conductor structures in the circuit board 20. The build-up layer 80 may include respective conductor structures or pads 110 and 115 that are interconnected or in ohmic contact with another set of conductor structures or pads 120 and 125 in the build-up layer 85 by way of respective vias 130 and 135 formed in the build-up layer 80. Similarly, the conductor pads 120 and 125 in the build-up layer 85 may be electrically connected to the overlying solder interconnect pads 65 and 70 in the solder mask 75 by way of respective vias 140 and 145. Electrical pathways through the build-up layers 90 and 95 and the solder mask 77 may be similarly provided by way of conductor pads 150 and 155 and vias 160 and 165 in the build-up layer 90, conductor pads 170 and 175 and corresponding vias 180 and 185 in the build-up layer 95 and ball pads 190 and 195 in the solder mask 77 that are connected to the vias 180 and 185. The solder balls 30 are metallurgically bonded to the ball pads 190 and 195. Electrical pathways through the core 87 may be provided by way of thru-vias 200 and 205, which may be plated thru holes or other types of conductors.

Still referring to FIG. 2, there may be multiple conductor traces interspersed around the solder interconnect pads 65 and 70 and covered by the solder mask 75. Two of these traces are depicted and labeled 210 and 215, respectively. The buildup layers 80, 85, 90 and 95 and the solder mask 77 may include multiple such traces that are not shown for simplicity of illustration. Indeed, there may be hundreds or more of such traces 210 and 215 to provide flexible routing of power, ground and/or signals in the circuit board 20. The solder joints 35 and 40 are fabricated with a bump pitch $x_1$, the size of which is dependent upon a variety of factors, such as the size of the semiconductor chip 15, the number of input/output pathways required for the semiconductor chip 15 and other considerations.

Figure 3:
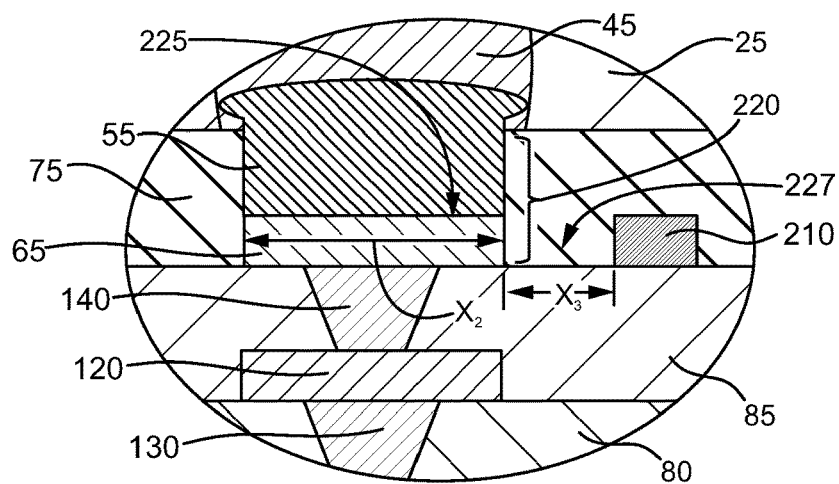
FIG. 3 is a portion of FIG. 2 shown at greater magnification.

The portion of FIG. 2 circumscribed by the dashed oval 217 will be shown at greater magnification in FIG. 3. Attention is now turned to FIG. 3. For the sake of context, FIG. 3 shows portions of the underfill 25, the solder bump 45, the presolder 55, the conductor pad 65, the solder mask 75 and the conductor trace 210. In addition, the buildup layers 80 and 85 and the vias 130 and 140 and the pad 120 are depicted. The presolder 55 is positioned in an opening 220 in the solder mask 75. A technical goal of this illustrative embodiment is to fabricate the conductor pad 65 and the opening 220 in the solder mask 75 with the same or approximately the same lateral dimension $x_2$. As described more fully below, this is accomplished by using the solder mask opening 220 as a limit on the potential lateral dimension $x_2$ of the pad 65. An objective is to eliminate or substantially limit any interfaces between an upper surface 225 of the conductor pad 65 and the solder mask 75. Another objective is to establish a gap 227 between the pad 65 and the trace 210 with a width $x_3$ that will be larger than a conventional fabrication process and structure to be described below.

Figure 4:
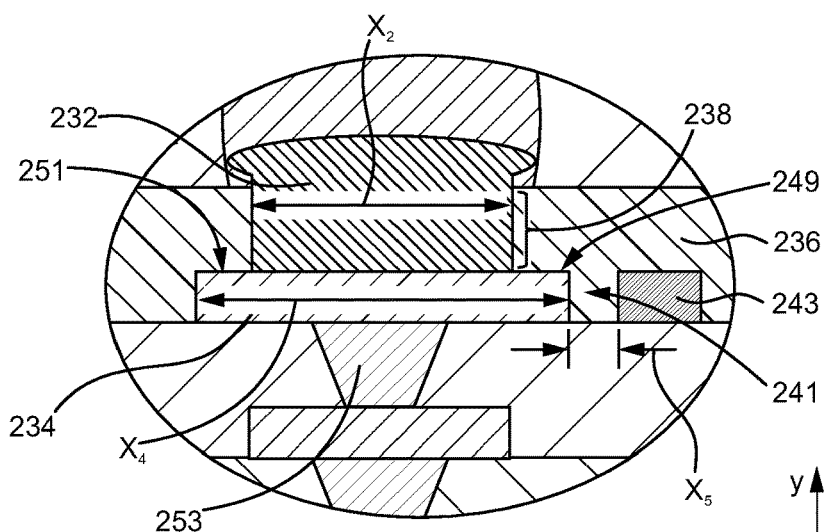
FIG. 4 is a sectional view like FIG. 3, but of a conventional circuit board structure.
Figure 5:
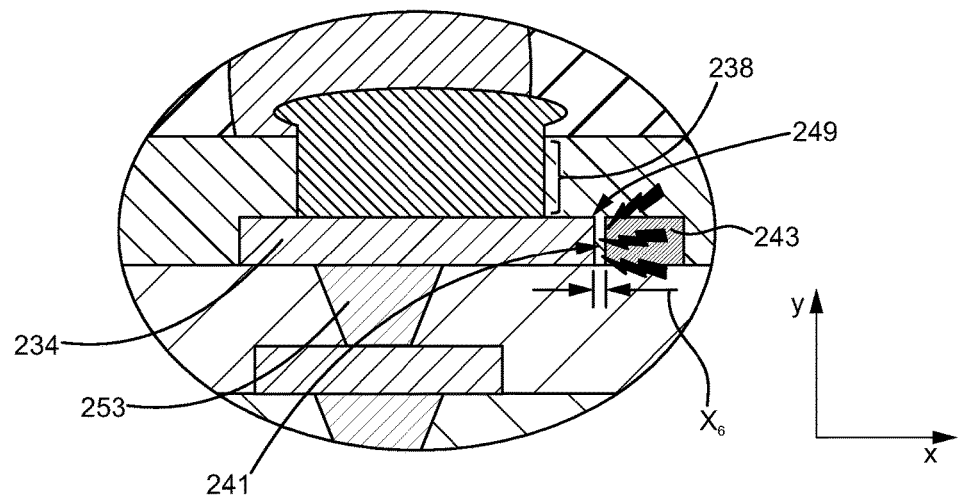
FIG. 5 is a sectional view like FIG. 3, but depicting hypothetical imperfect solder mask opening registration.
Figure 6:
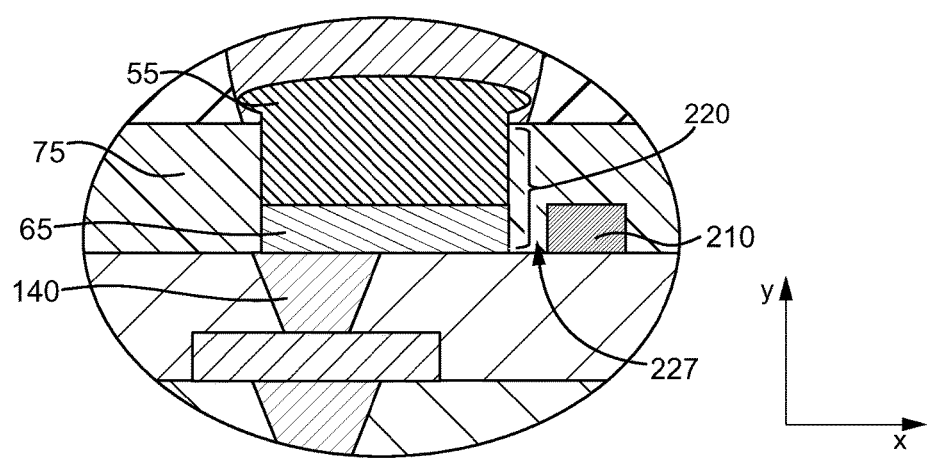
FIG. 6 is a sectional view like FIG. 4, but depicting hypothetical imperfect solder mask opening registration for a conventional circuit board structure.

To understand the benefit of eliminating a solder mask interface with the upper surface 225 of the pad 65, it may be useful to briefly review a conventional solder mask and pad arrangement as shown in FIG. 4. Note that FIG. 4 is a view like FIG. 3, but of a conventional conductor pad and solder mask arrangement. Here, a presolder 232 is fabricated on a conductor pad 234. A solder mask 236 is fabricated over the conductor pad 234 and patterned with an opening 238 to accommodate the presolder 232. The opening 238 has the lateral dimension $x_2$ but note also that the conductor pad 234 is fabricated with a lateral dimension $x_4$ that is typically about 20% larger than the lateral dimension $x_2$ of the pad 65 in the illustrative embodiment described above. There are a couple of technical fallouts from this design option in FIG. 4. The first is that the gap 241 between the conductor pad 234 and the conductor trace 243 has a width $x_5$ that is much smaller than the corresponding gap 227 between the conductor pad 65 and the trace 210. In addition, note that there is a substantial interface 249 between an upper surface 251 of the conductor pad 234 and the solder mask 236. The portion of the solder mask 236 at the interface 249 can delaminate and allow solder from the presolder 232 to migrate towards the trace 243 and possibly cause a short. The problem can be exacerbated in the event that the solder mask opening 238 is not well registered vertically with the position of the conductor pad 234 and/or the pad 234 is not well registered vertically with the via 253. For example, and as depicted in FIG. 5, where the opening 238 and thus the presolder 232 are poorly registered and thus laterally offset in the x-direction relative to the pad 234 and/or the pad 234 is offset in the same direction relative to the via 253, then the gap 241 has some width $x_6$ such $x_6<x_5$ and the potential for solder from the pre-solder 232 invading the interface 249 and shorting with the trace 243 may be even greater. Returning to FIG. 3, it is again noted that there is no or substantially no comparable interface between the solder mask 75 and the upper surface 225 of the pad 65 like the interface 249 just described in conjunction with FIG. 4. Thus, and as depicted in FIG. 6, imperfect registration of the pad 65, the opening 220 in the solder mask 75 and the presolder 55 with the via 140 in the x-direction will be less likely to cause shorts to the trace 210. This outcome is partly due to the larger sized gap 227, even with x-axis offset, relative to the conventional gap 241 shown in FIG. 5.

Figure 7:
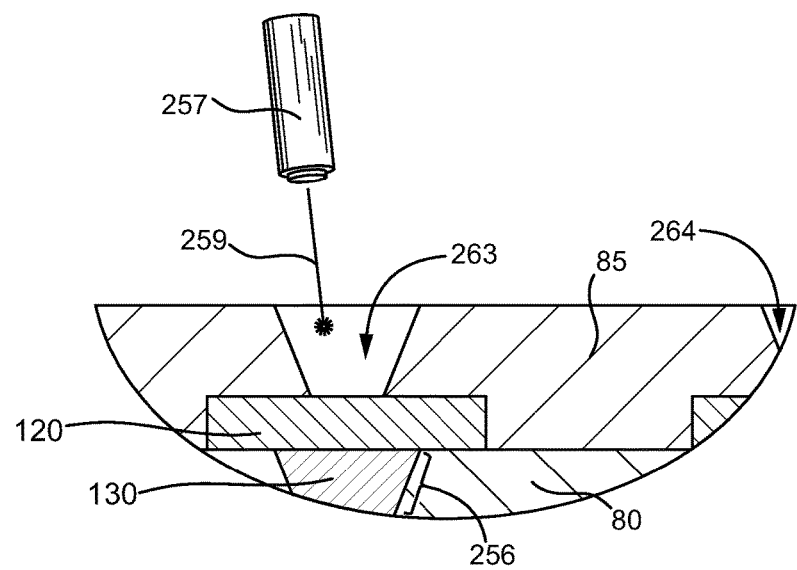
FIG. 7 is a sectional view depicting exemplary build-up layer and via opening formation.

An exemplary method for fabricating the conductor pad 65 and the solder mask 75 may be understood by referring now to FIGS. 7-10 and initially to FIG. 7. FIG. 7 is a sectional view like FIG. 3. The overlying semiconductor chip 15 depicted in FIG. 3 is not attached at this point and thus not depicted. The following description will focus largely on the conductor pad 65 and to a lesser extent on the conductor pad 70. However, the discussion is applicable to the other conductor pads interacting with the solder mask 75. At this point, the build-up layers 80 and 85 have been formed. An insulating material of the type(s) described elsewhere herein may be deposited by spin coating or other techniques and cured by heating or otherwise to establish the buildup layer 80. An opening 256 may be formed in the buildup layer 80 to accommodate the via 130 by laser cutting. A laser 257 may deliver the laser radiation 259 in pulses or as a continuous beam. The wavelength and spot size of the laser radiation 259 are selected to effectively ablate the material of the build-up layer 80 while producing the opening 256 with desired size and footprint. For example, radiation 259 in the ultraviolet range and with a spot size in the 2.0 to 5.0 micron range could be used. It is necessary for the opening 256 to be drilled completely to the underlying pad 110 (see FIG. 3), but some care should be exercised to ensure that the cutting process does not remove excessive material from the pad 110.

Still referring to FIG. 7, the via 130 may be formed in the opening 256 from a variety of conductor materials, such as copper, aluminum, silver, gold, titanium, refractory metals, refractory metal compounds, alloys of these or the like. In lieu of a unitary structure, the via 130 may consist of a laminate of plural metal layers, such as a titanium layer followed by a nickel-vanadium layer followed by a copper layer. In another embodiment, a titanium layer may be covered with a copper layer followed by a top coating of nickel. However, the skilled artisan will appreciate that a great variety of conducting materials may be used for the via 130. Various well-known techniques for applying metallic materials may be used, such as physical vapor deposition, chemical vapor deposition, plating or the like. In an exemplary embodiment, the vias may be formed by copper plating performed in two stages. The first stage involves the application of a relatively thin layer of copper in the opening 256 In a second stage a bulk plating process is performed to fill in the vias 130. It should be understood that the processes described herein for establishing the build-up layers 80 and 85 and affiliated conductors on the core 87 depicted in FIG. 2 may be used to establish the other build-up layers on the opposite of the core 87.

Still referring to FIG. 7, a conductor layer is applied, masked and etched to form the conductor pad 120 and the buildup layer 85 is applied using the techniques described above for the buildup layer 80. The conductor pad 120 may be formed using the materials and techniques described above for the via 130. Next, the opening 263 may be formed in the buildup layer 85 to accommodate the yet to be formed via 140 shown in FIG. 3. Laser drilling of the type described above using the laser 257 and laser radiation 259 may be used.

Figure 8:
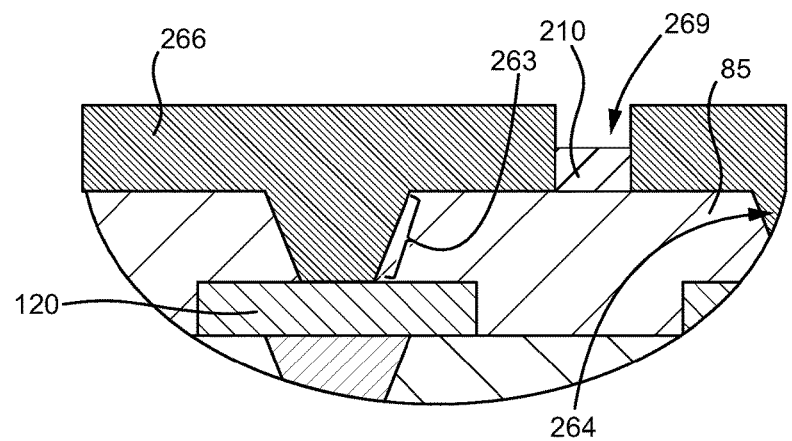
FIG. 8 is a sectional view like FIG. 7, but depicting exemplary masking and trace formation.

Next, and as shown in FIG. 8, selected portions of the buildup layer 85 are masked with a suitable mask 266 that may be a dry film or photoresist. The via openings 263 and 264 are covered, but an opening 269 in the mask 266 is patterned. Well-known lithography techniques may be used to apply and pattern the mask 266. Next, a plating process may be used to form the trace 210 in the opening 269. The trace 210 may be formed of same materials described above in conjunction with the conductor pad 120. The mask 266 may be removed by ashing, solvent stripping or both.

Figure 9:
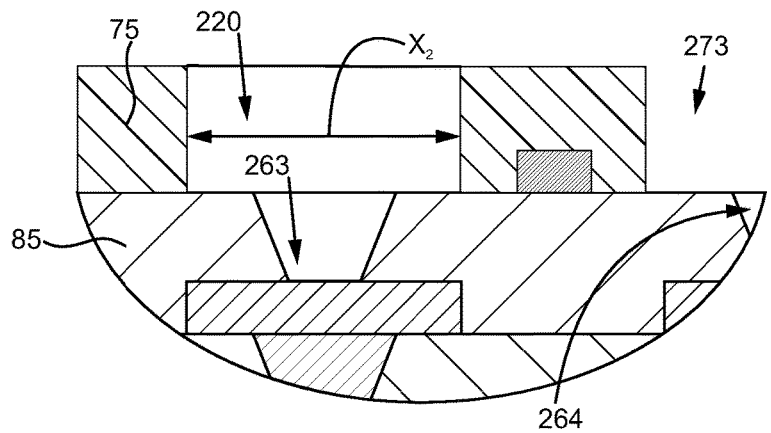
FIG. 9 is a sectional view like FIG. 8, but depicting exemplary solder mask formation.

Referring now to FIG. 9, the solder mask 75 may be deposited on the buildup layer 85 using well-known solder mask deposition techniques, such as spin coating or other deposition techniques as desired. The opening 220 and a similar 273 may be formed in the solder mask 75 over the via openings 263 and 264 by well-known lithographic patterning techniques. For example, the solder mask 75 may be infused with one or more photo active chemicals and an exposure and a developing process used to establish the openings 220 and 273. The openings 220 and 273 may be patterned with a lateral dimension $x_2$ which is the preferred dimension of the conductor pad 65 to be formed in a subsequent process. Thus in this illustrative embodiment, the solder mask 75 and the openings 220 and 273 are used to define the lateral dimensions of the later-formed solder interconnect pads 65 and 70. This is in contrast to a conventional process in which the conductor pad 65 would be patterned by conventional masking and etch removal.

Figure 10:
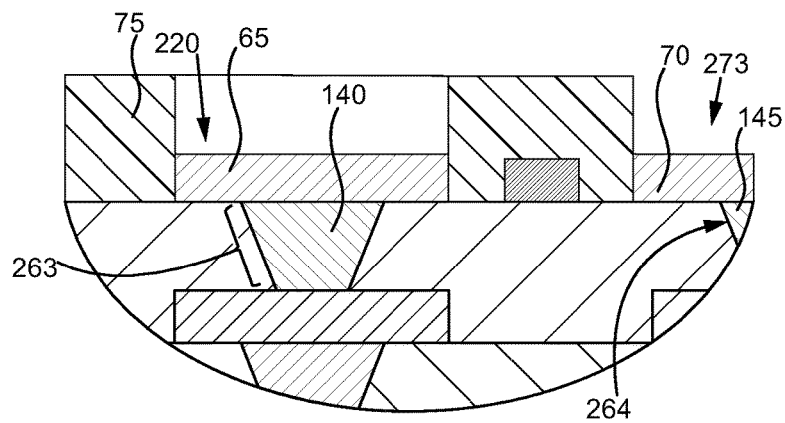
FIG. 10 is a sectional view like FIG. 9, but depicting exemplary via and solder interconnect pad formation.

Next and as shown in FIG. 10, the vias 140 and 145 may be established in the openings 263 and 264 and the solder interconnect pads 65 and 70 may be established in the solder mask openings 220 and 273 using the materials and techniques described above for the conductor pad 120 and the via 130 shown in FIG. 7. Note that the solder mask openings 220 and 273 set the lateral dimensions of the pads 65 and 70.

At this point, and referring again to FIG. 3, the presolder 55 may be positioned in the opening 220 (and also the presolder 60 though not shown) and coined as shown. For example, a solder paste may be applied by stencil or the like. A reflow may be performed at this point to bond the presolder 55 to the underlying conductor pad 65. Following the application of the presolders 55, the semiconductor chip 15 depicted in FIGS. 1 and 2 may be positioned on the circuit board 20 and mounted to the presolder 55. A reflow process may be performed to create the solder joints 35 and 40 depicted in FIG. 2. The temperature and duration of the reflow will depend upon the types of solders and the geometry of the circuit board 20 and the semiconductor chip 15.

Figure 11:
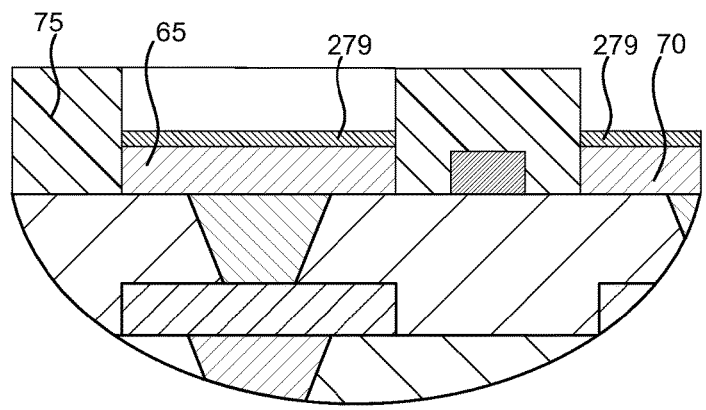
FIG. 11 is a sectional view like FIG. 10, but depicting additional metal placement on a solder interconnect pad.

As shown in FIG. 11, other materials may be applied to the solder interconnect pads 65 and 70 at this stage. This may be desirable in circumstances where there is concern that solder constituents may diffuse into the solder interconnect pads 65 and 70 and degrade their electrical performance. In this illustrative embodiment, a conductor layer 279 may be applied to the solder interconnect pads 65 and 70, again using the solder mask 75 to mask other features. The composition of the conductor layer 279 may vary greatly depending upon the requirements of the device. For example, in an exemplary embodiment the conductor layer 279 may consist of a laminate starting from the bottom of an electroless plated nickel layer followed by a plated palladium layer and finally a plated gold layer. Again, the material selected for the conductor layer 279 will depend upon technical requirements such as the types of solders to be used for the pre-solder if present and the solder bump 45 depicted in FIG. 2. Here, the conductor layer 275 provides a barrier to prevent solder from diffusing into the underlying solder interconnect pads 65 and 70 and whatever vias are present.

Figure 12:
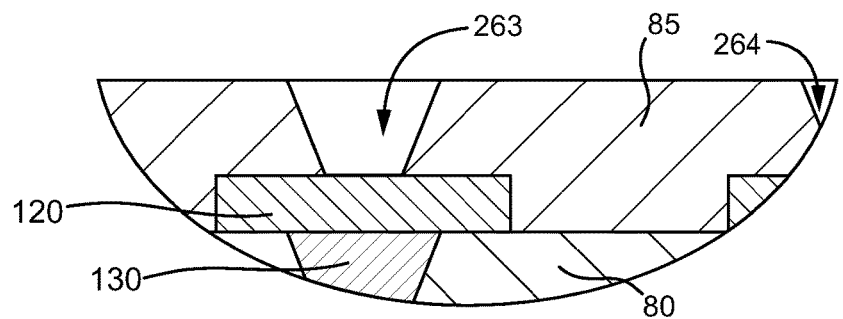
FIG. 12 is a sectional view like FIG. 7 depicting alternate exemplary build-up layer and via opening formation.
Figure 13:
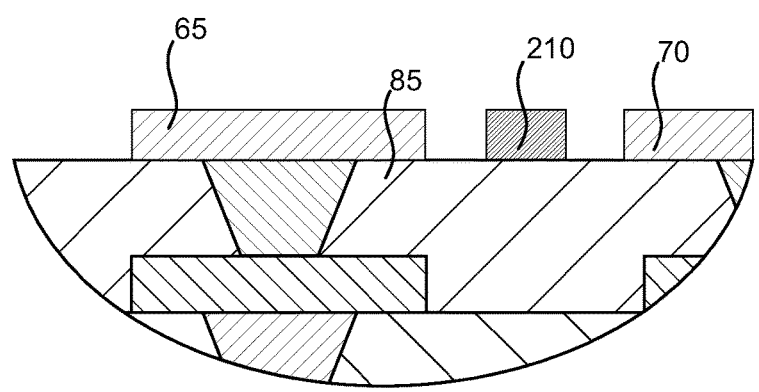
FIG. 13 is a sectional view like FIG. 12, but depicting exemplary solder interconnect pad and trace formation.
Figure 14:
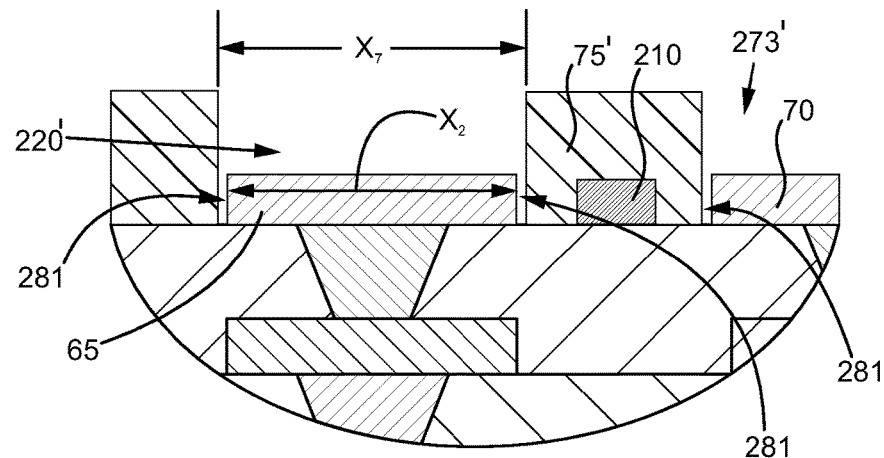
FIG. 14 is a sectional view like FIG. 13, but depicting alternate exemplary solder mask formation.

In the foregoing illustrative embodiment, solder mask formation precedes the fabrication of the conductor pad 65 as shown, for example, in FIGS. 2 and 3. However, in an alternate exemplary embodiment, the solder mask may be formed after the conductor pad 65. In this illustrative embodiment and as shown in FIG. 12, the process may be performed as generally described above to establish the build up layers 80 and 85, the via 130 and the conductor pad 120. At this point the openings 263 and 264 are established in the build up layer 85 as described above. Next and as shown in FIG. 13, the solder interconnect pads 65 and 70 and the conductor trace 210 may be formed by applying a suitable conductor layer to the buildup layer 85, followed by a suitable masking and etch removal. Next and as shown in FIG. 14, a solder mask 75' may be applied on the build up layer 85 and over the conductor trace 210. The solder mask 75' may be patterned with openings 220' and 273'. Whereas the solder interconnect pads 65 and 70 are advantageously fabricated with a lateral dimension $x_2$ as described above, the openings 220' and 273' are patterned with a lateral opening $x_7$ which is slightly larger than the lateral dimension $x_2$ of the pad 65 so as to leave a small gaps 281 bracketing the solder interconnect pads 65 and 70. Obviously, when viewed from above, the gaps 281 will appear as moats around the solder interconnect pads 65 and 70. In a subsequent material deposition process, particularly a plating process, conductor material will be drawn into and fill the gaps 281.

Figure 15:
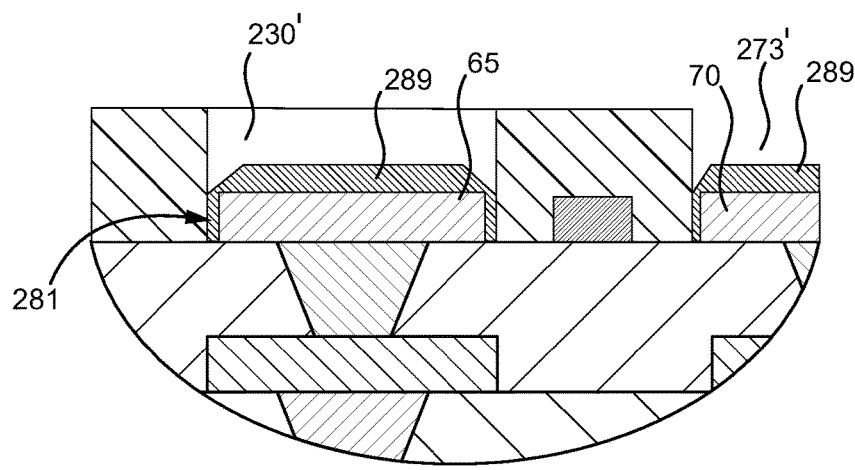
FIG. 15 is a sectional view like FIG. 14, but depicting placement of additional metal on the solder interconnect pad.

Next and as depicted in FIG. 15, a plating process may be used to partially fill the openings 220' and 273' with additional metal of the types described above. As noted above, the gaps 281 will draw in some of the deposited material 289, and in this sense the placement of the material is part of the process of forming the solder interconnect pads 65 and 70. Part of the motivation behind doing this auxiliary deposition process or plating process in order to establish the material 289 is to provide some additional conductive material in the event there is imperfect vertical registration between the openings 220' and 273' and the underlying solder interconnect pads 65 and 70. Following the deposition of the material 289, the pre-solder and/or solder bump processes may precede as generally described above.

It should be understood that the processes described herein could be performed on a discrete circuit board or en masse on a strip or other aggregation of circuit boards. If done en masse, the individual circuit boards may be singulated at some stage by sawing or other techniques.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   forming a solder mask on a circuit board with a first opening having a sidewall;
   forming a solder interconnect pad in the first opening; and whereby the sidewall sets the lateral extent of the solder interconnect pad during the formation of the solder interconnect pad.

2. The method of claim 1, wherein the first opening is formed and metal is placed in the first opening to form the solder interconnect pad.

3. The method of claim 2, comprising forming a second opening in an interconnect layer of the circuit board that exposes an underlying conductor pad and forming the solder mask so that the first opening is aligned with the second opening.

4. The method of claim 3, comprising forming a conductive via in the second opening and the solder interconnect pad on the conductive via.

5. The method of claim 1, wherein the solder interconnect pad is formed and thereafter the solder mask and first opening are formed without contacting the solder interconnect pad and metal is added to the solder interconnect pad and between the solder interconnect pad and the sidewall.

6. The method of claim 1, comprising coupling a solder bump on the solder interconnect pad.

7. The method of claim 1, comprising coupling a semiconductor chip to the circuit board.

8. The method of claim 1, comprising forming the solder mask and the solder interconnect pad using instructions stored in a computer readable medium.

9. The method of claim 1, comprising coupling plural solder balls to the semiconductor chip package substrate.

10. A method of manufacturing, comprising:
forming a solder mask on a semiconductor chip package substrate, the mask including a first opening having a sidewall;
forming a solder interconnect pad in the first opening;
whereby the sidewall sets the lateral extent of the solder interconnect pad during the formation of the solder interconnect pad.

11. The method of claim 1, wherein the first opening is formed and metal is placed in the first opening to form the solder interconnect pad.

12. The method of claim 11, comprising forming a second opening in an interconnect layer of the semiconductor chip package substrate that exposes an underlying conductor pad and forming the solder mask so that the first opening is aligned with the second opening.

13. The method of claim 12, comprising forming a conductive via in the second opening and the solder interconnect pad on the conductive via.

14. The method of claim 10, wherein the solder interconnect pad is formed and thereafter the solder mask and first opening are formed without contacting the solder interconnect pad and metal is added to the solder interconnect pad and between the solder interconnect pad and the sidewall.

15. The method of claim 10, comprising coupling a semiconductor chip to the semiconductor chip package substrate.

16. A circuit board, comprising:
a solder mask on a circuit board with a first opening having a sidewall; and
a solder interconnect pad in the first opening and laterally abutting the sidewall, the sidewall setting the lateral extent of the solder interconnect pad.

17. The circuit board of claim 16, comprising coupling a solder bump on the solder interconnect pad.

18. The circuit board of claim 16, comprising a semiconductor chip coupled to the circuit board.

19. The circuit board of claim 16, wherein the solder interconnect pad includes an upper surface and the solder mask makes substantially no contact with the upper surface.

20. The circuit board of claim 16, wherein the circuit board comprises a semiconductor chip package substrate.

* * * * *